United States Patent [19]
Glick et al.

[11] Patent Number: 5,823,593
[45] Date of Patent: Oct. 20, 1998

[54] DEVICE FOR LIFTING WAFER CASSETTES FROM A SPRAYING TOOL

[75] Inventors: Jeffrey S. Glick, Cupertino; Kimberly J. Spencer, San Jose, both of Calif.

[73] Assignee: Advanced Micro Devices, Inc., Sunnyvale, Calif.

[21] Appl. No.: 868,847

[22] Filed: Jun. 9, 1997

[51] Int. Cl.[6] .................................................. B65D 25/28
[52] U.S. Cl. ............................................ 294/27.1; 294/15
[58] Field of Search .................................. 294/1.1, 15, 16, 294/27.1, 33, 92, 137, 145; 16/114 R; 206/710, 711; 211/41.18; 118/500, 503

[56] References Cited

U.S. PATENT DOCUMENTS

| | | | |
|---|---|---|---|
| 4,964,664 | 10/1990 | Crittenden | 294/15 |
| 5,029,922 | 7/1991 | DiNapoli et al. | 294/27.1 |
| 5,364,144 | 11/1994 | Satterfield et al. | 294/27.1 |
| 5,390,972 | 2/1995 | Galloway | 294/15 |
| 5,658,028 | 8/1997 | Bergam et al. | 294/15 |

*Primary Examiner*—Dean Kramer
*Attorney, Agent, or Firm*—Davis Chin

[57] ABSTRACT

A handler attachment device used for loading and unloading of wafer cassettes into and out of a spray processing tool is comprised of a rectangularly-shaped main body member, two U-shaped gripping members, and two L-shaped bracket members all interconnected together. The main body member includes a narrow middle section and opposed first and second end sections having angled mounting areas disposed therein. The two U-shaped gripping members are mounted to the corresponding first and second mounting areas on the body member. The two L-shaped bracket members are mounted to opposed side edges of the body member for engaging with the wafer cassette. The U-shaped gripping members are grasped by the corresponding hands of an operator in a manner so as to reduce and minimize fatigue and stress to his hands, wrists and arms.

18 Claims, 4 Drawing Sheets

DEVICE FOR LIFTING WAFER CASSETTES FROM A SPRAYING TOOL

BACKGROUND OF THE INVENTION

1. Field of the Invention

This invention relates generally to wafer cassettes used in semiconductor cleaning apparatus for cleaning semiconductor wafers. More particularly, it relates to an improved handler attachment device of a unique construction used for manually lifting wafer cassettes from a spraying processor tool which is ergonomically correct so as to reduce fatigue and stress to the user.

As is generally known to those skilled in the art of manufacturing integrated circuit devices or wafer-scale integrated circuit devices, there exists a number of process steps involved in the wafer fabrication process. Some of these manufacturing process steps may be accomplished by placing the semiconductor wafers into a spraying processor tool where cleaning and stripping processes are performed.

One such type of spray processing tool for processing silicon wafers is commercially available from FSI International, Inc., 322 Lake Hazeltine Dr., Chaska, Minn. 553138 and is referred to as a Mercury® MP spray processing system. As is shown in FIG. 1, the spray processing system 10 from FSI International includes a bowl-like member 12 and a closable lid 14. Adjacent the interior bottom wall of the bowl-like member 12, there is provided a turntable (not shown) which is connected to one end of a rotating shaft. The other end of the rotating shaft is operatively connected to an electric motor so as to rotate the turntable. Adjacent the circumferential edge of the turntable, there are mounted four (4) pairs of spaced-apart upright members 16a and 16b which are disposed equidistant around the circumference of the turntable. Each pair of the upright members are adapted to hold or retain a corresponding one of the semiconductor wafer cassettes 18 onto the top surface of the turntable. Each of the four wafer cassettes 18 is used to house a plurality of semiconductor wafers 20 which are to be processed.

The spray processing system 10 further includes a vertical post member 22 which is positionable in the center of the turntable when the lid 14 is closed over the upper end of the bowl-like member 12. The post member includes a plurality of spraying nozzles (not shown) mounted vertically along the length thereof. When the bowl-like member is closed by the lid defining a process chamber, there is provided an enclosed, nitrogen-purged environment for wafer processing. As the turntable is rotated, the spraying nozzles on the post member dispense atomized chemical mixtures, deionized rinse water and dry nitrogen onto the semiconductor wafers 20 loaded into the wafer cassettes 18. In this manner, the spray processing system 10 performs wet chemical processing for critical cleaning, controlled etch, photo resist stripping and other additional processes on the semiconductor wafers 20.

As the state-of-the-art in integrated circuit technology advances, semiconductor manufacturers are continuing to reduce line-width geometries while the sizes of the semiconductor wafers are being made larger and larger which increases correspondingly the size of the wafer cassettes. At present, the semiconductor wafers may be as large as 200 mm (8 in.) in diameter. One type of wafer cassette is commercially available from Fluoroware of Chaska, Minn., for accommodating or holding a capacity of twenty-five (25) 200 mm wafers for use in spray processing systems and is referred to under their part designation A192-81M. The wafer cassettes 18 illustrated in FIG. 1 are assumed to be of this type. Each of the wafer cassettes has a width dimension of 203.2 mm (8.00 in.), a length dimension of 234.2 mm (9.22 in.), and a height dimension of 155.6 mm (6.13 in.). The wafer cassettes are made from a plastic material such as PFA (perfluroalkoxy) and weigh approximately 3.3 lbs. empty. A fully loaded wafer cassette (housing 25 wafers) weighs approximately 5.9 lbs.

The wafer cassette is of a cylindrically-shaped construction and includes an opened upper portion, an opened lower portion, and a plurality of grooves extending between the upper and lower portions for holding the plurality of wafers therein. The cassette 18 also includes a front end wall 24 having opposite side extension flanges 26 adapted for robotic handling to move the wafer cassettes to and from the processor chamber of the spray processing system. The end wall 24 has also a handle portion 28 having a pair of openings 30 for allowing manual lifting of the cassettes by an operator or user, as shown in FIG. 2. As can be seen, the operator is required to grasp the handle portion 28 on the front end wall 24 with only one hand due to space limitations and to bend his or her wrist in order to perform the task of insertion and removal of the cassettes 18.

One primary concern that must be addressed by the operator or his employer is the reducing, eliminating, or preventing of disorder of the hand, wrist and arms when performing the task consisting of highly repetitive motions (i.e., lifting of the cassettes in and out of the process chamber) for eight hours a day and five days a week. It is generally known that cumulative trauma disorders such as carpal tunnel syndrome and tendinitis may be caused or exacerbated by repetitive, forceful exertion of the hand, wrist and arm, especially when combined with awkward posture (such as wrist flexion or other deviation). It has been observed by the inventors that the operators lifting the wafer cassettes using only one hand applied to the handle portion suffer from fatigue and stress after periods of weeks, months and years of such repetitive motion due to the relatively heavy weight of the fully loaded wafer cassettes. Therefore, it would be desirable to design a handler attachment device of a unique construction for use with the wafer cassettes so as to reduce fatigue or stress on the operator.

There are known in the prior art handle attachment devices for use with the 200 mm wafer cassettes. Such devices are also manufactured and sold by Fluoroware. These are referred to as their 200 mm handle-end-load handle style and designated by Part No. A057-1 and A057-2. They also make a 200 mm handles-slingshot style designated with their Part No. A192-80. However, these handle devices are typically for one-hand operation and thus still cause stress on the operator. While there is also known in the art of two-handed devices, they are not made to accommodate the 200 mm wafer cassettes and are generally made so as to accommodate robotic handling equipment. Such two-handed devices are produced by Recif, Inc. of San Jose, Calif. 95112.

The present invention represents a significant improvement over the prior art handle devices. The instant handler attachment device allows both hands of the operator to be used for lifting the wafer cassettes so as to reduce the load thereon. Further, the handler attachment device includes angled U-shaped gripping members which are ergonomically correct so as to reduce fatigue and stress to the operator.

SUMMARY OF THE INVENTION

Accordingly, it is a general object of the present invention to provide an improved handler attachment device which is relatively simple and economical to manufacture and assemble, but yet overcomes the disadvantages of the prior art handle devices.

It is an object of the present invention to provide an improved handler attachment device used for manually lifting wafer cassettes from a spraying processor tool which is ergonomically correct so as to reduce fatigue and stress to the operator.

It is another object of the present invention to provide a handler attachment device used for manually lifting wafer cassettes from a spraying processor tool which allows for a two-handed operation so as to reduce loading.

It is still another object of the present invention to provide an improved handler attachment device used for manually loading and unloading of wafer cassettes into and out of a spraying processor tool which includes a main body member, two U-shaped gripping members, and two L-shaped bracket members all interconnected together.

In accordance with a preferred embodiment of the present invention, there is provided a handler attachment device used for loading and unloading of wafer cassettes into and out of a spraying processor tool. The handler attachment device includes a rectangularly-shaped main body member, two U-shaped gripping members, and two L-shaped bracket members. The main body member includes a front surface, a bottom surface, a top edge, a bottom edge, and opposed side edges. The top edge has a U-shaped cut-out portion disposed in its intermediate area so as to define a narrow middle section and opposed first and second end portions. The top edge extends along a horizontal axis. The first end section has a first angled mounting area which includes a first transverse axis extending downwardly in a counter-clockwise direction with respect to the horizontal axis so as to form a first acute angle therebetween. The second end portion has a second angled mounting area which includes a second transverse axis extending downwardly in a clockwise direction with respect to the horizontal axis so as to form a second acute angle therebetween.

Each of the two U-shaped gripping members has a relatively long gripping arm portion and opposed short arm portions. One of the short arm portions has a top edge extending along a longitudinal axis and a chamfered portion formed with a third transverse axis. The third transverse axis forms a third acute angle with respect to the longitudinal axis. The chamfered portions on the one of the short arm portions of each of the two U-shaped members are mounted on the corresponding first and second mounting areas on the body member. The long gripping arm portions are gripped by the operator in a manner which reduces and minimizes fatigue and stress to his hands, wrists, and arms.

The two L-shaped bracket portions have a longer leg portion and a shorter leg portion. Each of the longer leg portions is mounted on the corresponding opposed side edges of the body member so that the shorter leg portion extends inwardly therefrom. The shorter leg portion of the L-shaped bracket members and the back surface of the body member form a channel for contactly engaging with the wafer cassettes.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
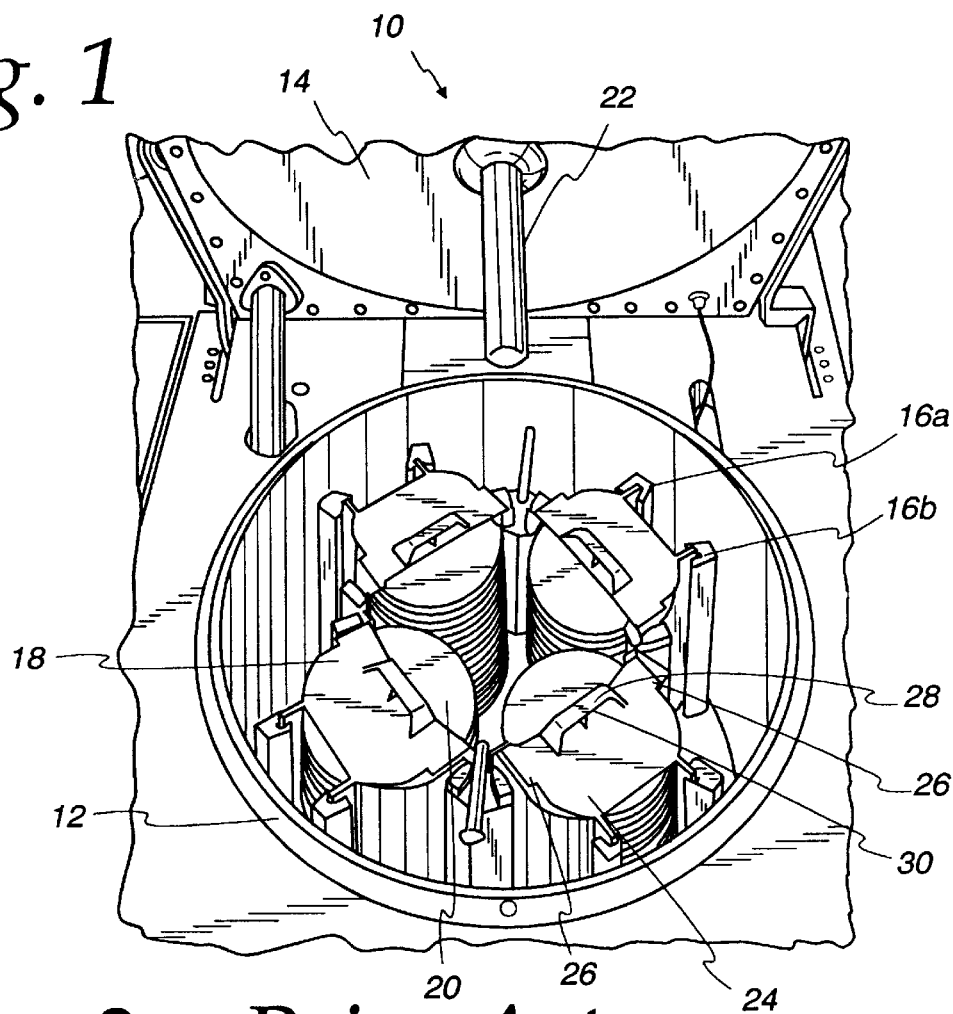
FIG. 1 is a top view of a conventional spray processing tool having a plurality of wafer cassettes loaded with wafers.
Figure 2:
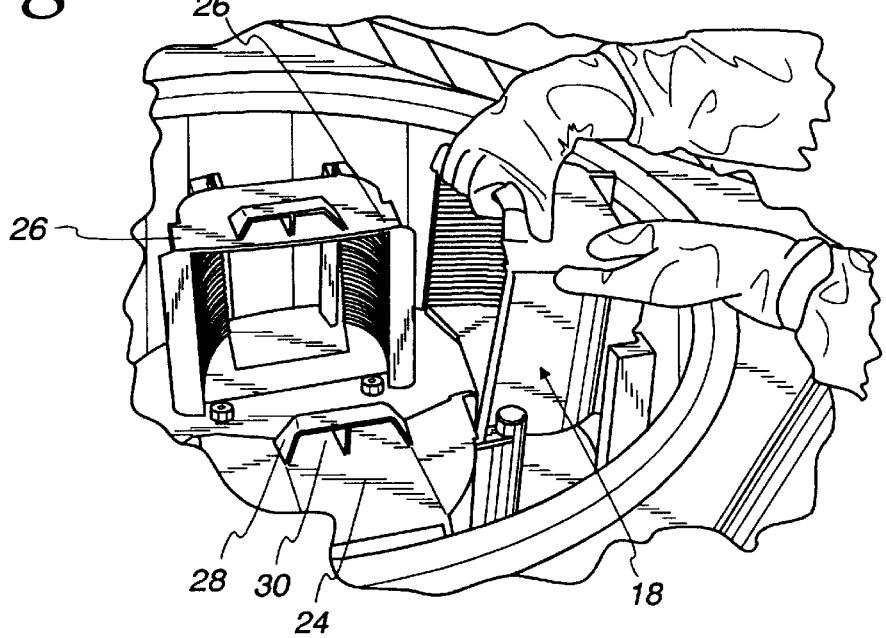
FIG. 2 is a perspective view, illustrating the one-handed operation for loading a wafer cassette into the spray processing tool.
Figure 3:
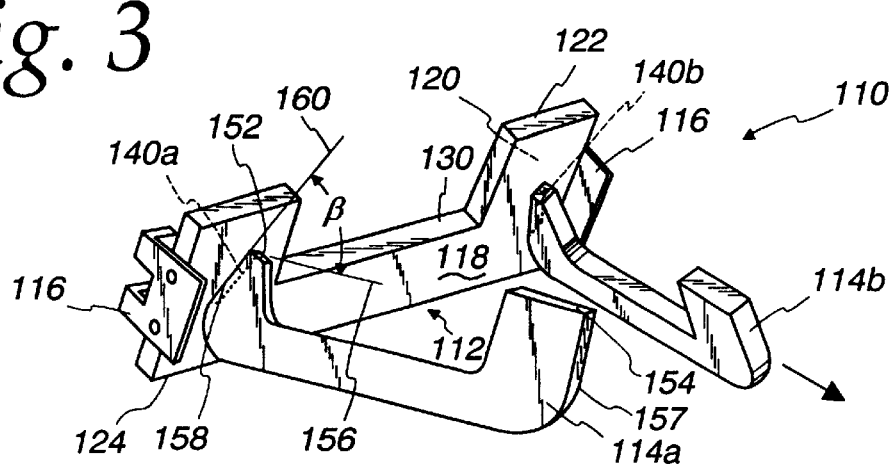
FIG. 3 is a perspective view of a handler attachment device, constructed in accordance with the principles of the present invention.
Figure 4:
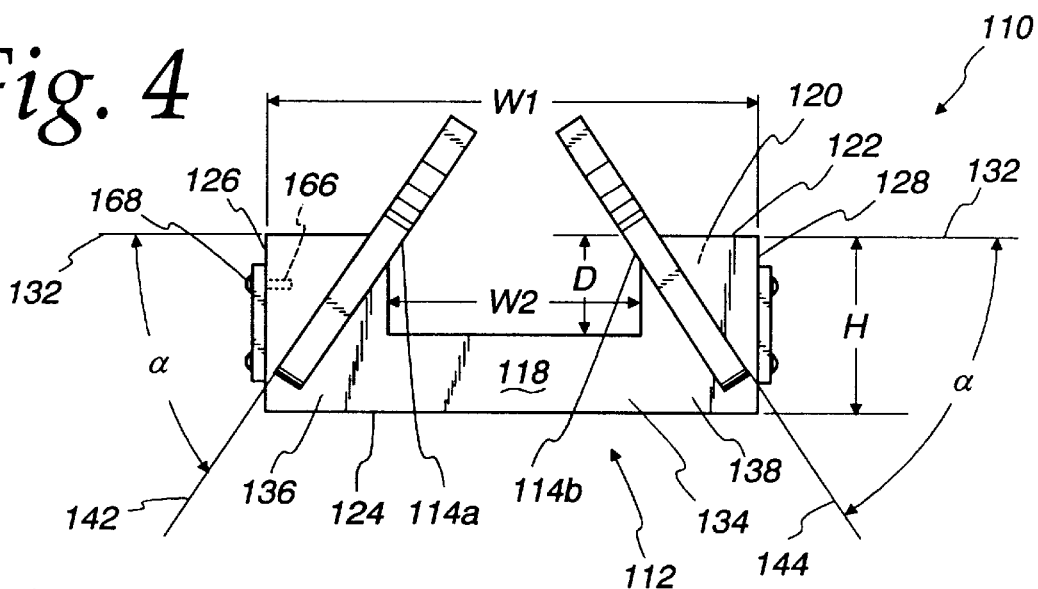
FIG. 4 is a front plan view of the handler attachment device of FIG. 3.

Referring now in detail to the various views of the drawings, there is shown in FIG. 3 a perspective view of a handler attachment device 110 constructed in accordance with the principles of the present invention. The handler attachment device 110 of the present invention is of a unique construction and is adapted especially for use in manually loading and unloading of the wafer cassettes 18 (FIG. 1) loaded with semiconductor wafers 20 into and out of the process chamber of the spray processing tool 10 as illustrated in FIGS. 1 and 2. In view of the new and novel construction of the instant handler attachment device 110 which is ergonomically correct, there has been substantially eliminated or reduced the fatigue and stress of the operator's hands, wrists and arms during its use.

As can best be seen from FIGS. 3 through 6, the handler attachment device 110 used for lifting the wafer cassettes 18 (FIG. 1) is basically comprised of a rectangularly-shaped main body member 112, a pair of U-shaped gripping members 114a and 114b, and two L-shaped bracket members 116 all interconnected together. All of the members 112, 114, and 116 are preferably made from a durable plastic material.

The main body member 112 has a width dimension W1 of approximately 8 5/16 in. and a height dimension H of approximately 3 in. The rectangularly-shaped main body member 112 includes a front surface 118, a back surface 120, a top edge 122, a bottom edge 124, and opposed side edges 126, 128. A U-shaped cut-out portion 130 is formed in the intermediate area of the top edge 122. The cut-out portion 130 has a width dimension W2 of approximately 4 5/16 in. so as to accommodate the handle portion 28 on the front end wall 26 of the wafer cassette 18. The cut-out portion has a depth dimension D of approximately 1 11/16 in. which extends from a horizontal axis 132 lying on the top edge 122.

It will thus be noted that the body member 112 consists of a narrow middle section 134, a left end section 136, and a right end section 138 all formed integrally together. A first angled mounting area 140a is formed in the left end section 136 and includes a transverse axis 142 disposed in the middle thereof. Similarly, a second angled mounting area 140b is formed in the right end section 138 and includes a transverse axis 144 disposed in the middle thereof. The first transverse axis 142 extends downwardly in a counter-clockwise direction with respect to the horizontal axis 132 so as to form an acute angle α. The second transverse axis 144 extends downwardly in a clockwise direction with respect to the horizontal axis 132 so as to form an acute angle α. In a preferred embodiment, the acute angle a is in the range of 30°–60° and is most preferably approximately 55°.

Figure 5:
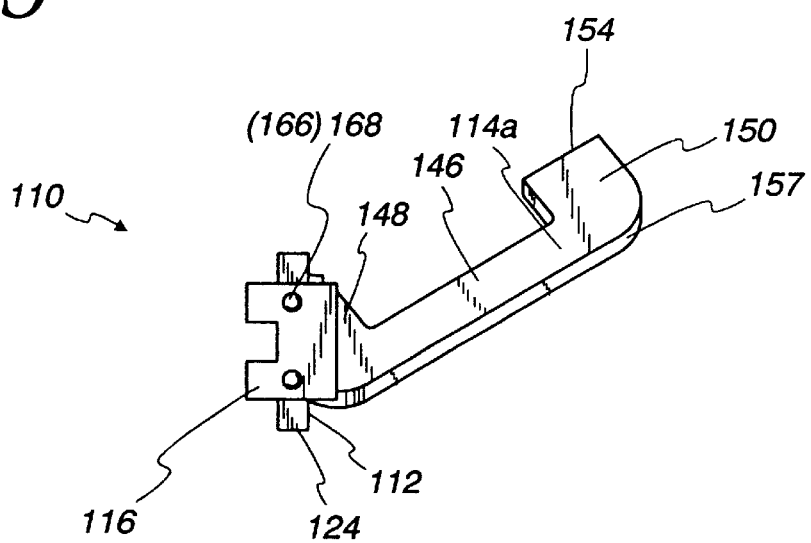
FIG. 5 is a side elevational view of the handler attachment device of FIG. 3.

Since the U-shaped gripping members 114a and 114b are identical in their construction, it will be sufficient to describe in detail the member 114a, as depicted in FIG. 5. The member 114a includes a relatively longer gripping arm portion 146, a short mounting arm portion 148, and a short distal arm portion 150 all formed integrally together. The gripping arm portion 146 may be of a varying dimension so as to accommodate the different size hands of the operator. This permits the operator to grasp firmly and properly the gripping arm portions 146 with an over-the-top handed grip.

The short mounting arm portion 148 has a top edge 152, and the distal arm portion 150 has a top edge 154 which is co-planar with the top edge 152. The top edges 152 and 154 lie along a longitudinal axis 156. The distal arm portion 150 is formed with an outer radius 157. The short mounting arm 148 includes a chamfered portion 158 having a transverse axis 160 which forms an acute angle β with respect to the longitudinal axis 156. In a preferred embodiment, the acute angle β is in the range of 30°–70° and is most preferably at 65°. The chamfered portion 158 is dimensioned so that it can be secured on the corresponding first and second angled mounting areas 140a and 140b of the body member 112. There are a number of conventional means known in the art for mounting the chamfered portion, such as by welding or bolting the same to the body member. This angled mounting of the gripping members allows the operator to grip comfortably the handler device.

Figure 6:
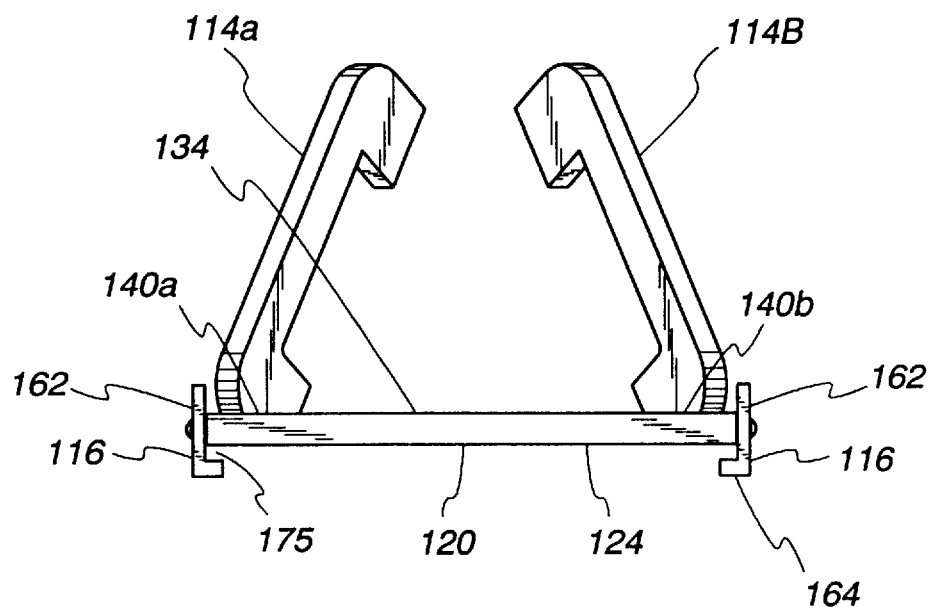
FIG. 6 is a bottom view of the handler attachment device of FIG. 3.

Since each of the L-shaped bracket members 116 are identical in their construction, it will be sufficient to describe in detail only one of them. As is shown in FIGS. 5 and 6, the bracket member 116 includes a longer leg portion 162 and a shorter leg portion 164 joined to the longer leg portion 162. The longer leg portion 162 is of a substantially square shape and includes a pair of holes 166 set for receiving screws 168 so as to fixedly secure the bracket members to the opposed side edges 126, 128. Alternatively, the longer leg portions 162 may be welded to the opposed side edges 126, 128. The shorter leg portion 164 projects inwardly from the longer leg portion 162. Further, the shorter leg portion 164 of the L-shaped bracket members 116 and the back surface 120 of the body member 112 form a channel 175 therebetween so as to engage the respective side extension flanges 26 located on the front end wall 24 of the wafer cassettes 18. In other words, the extension flanges 26 are sandwiched between the shorter leg portions 164 and the back surface 120 of the body member 112.

In order to assemble the handler attachment device, the chamfered portions 158 of the U-shaped members 114a and 114b are fixedly secured to the corresponding angled mounting areas 140a and 140b on the front surface 118 of the body member 112. Further, the bracket members 116 are fixedly secured to the opposed side edges 126, 128 of the body member 112. The fully assembled handler attachment device 110 of the present invention is illustrated in FIG. 3. The handler attachment device 110 may alternatively be molded as a single piece in order to avoid assembly costs.

Figure 7:
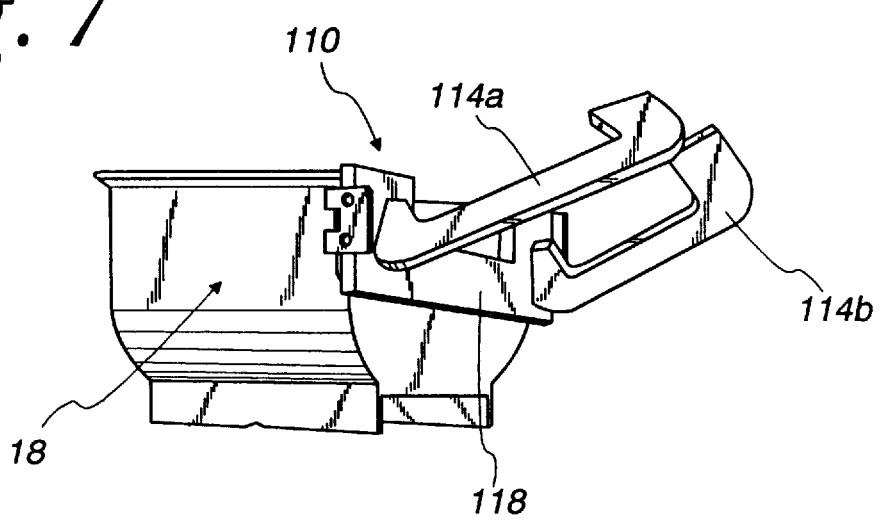
FIG. 7 is a perspective view of the handler device similar to FIG. 3, but attached to a wafer cassette.
Figure 8:
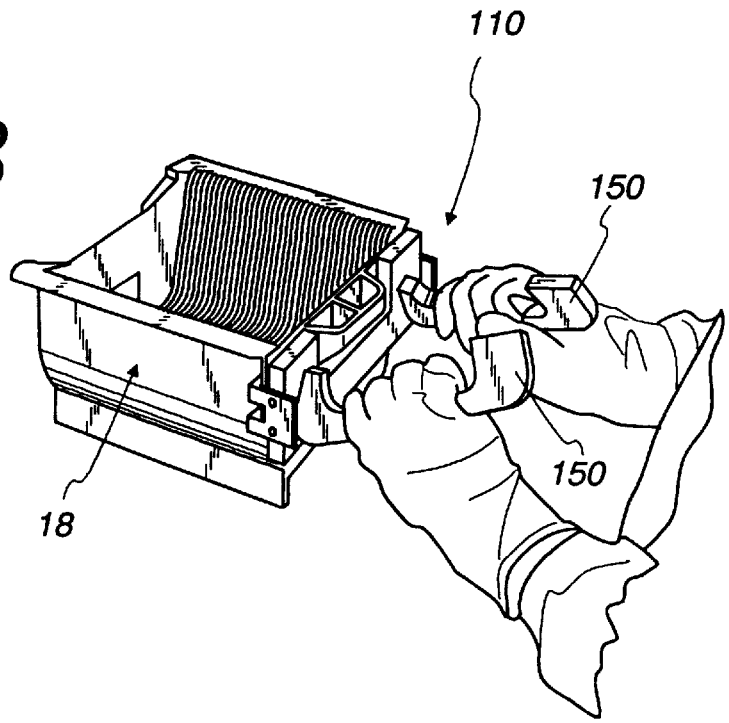
FIG. 8 is a perspective view, illustrating how both hands of the operator are used to initially grip the handler attachment device in accordance with the present invention.

In use, the handler attachment device 110 is attached to the front end wall 24 of the wafer cassette 18 by sliding upwardly the body member 112 so as to contactly engage the opposed side extension flanges 26. It will be noted that in addition to the sandwiching of the opposed extension flanges, the narrow middle portion 134 of the body member 112 will abut against the bottom edge of the handle portion 28 of the wafer cassette 18 as illustrated in FIG. 7.

Figure 9:
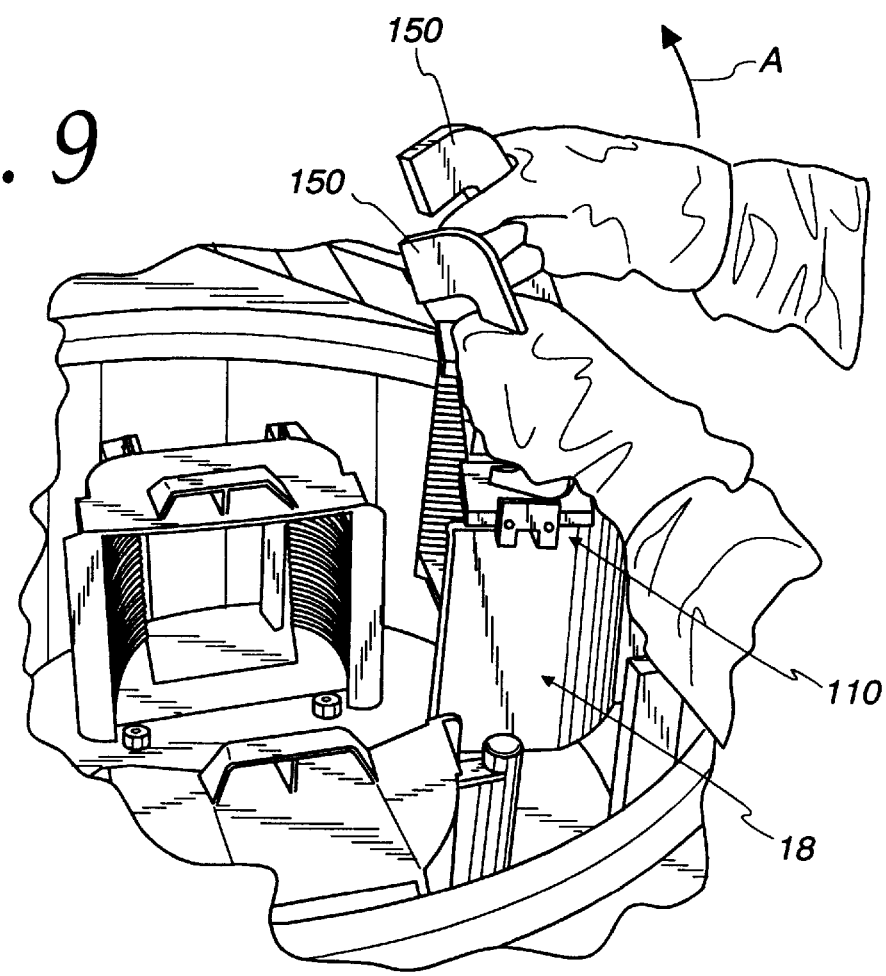
FIG. 9 is a perspective view illustrating the two-handed operation for loading the wafer cassette into the spray processing tool, according to the present invention.

With reference to FIG. 9, there is shown the handler attachment device 110 of the present invention which is gripped initially by both hands of the operator so as to distribute the loading on the hands and arms. For convenience of illustration, the wafer cassettes are shown with the wafers removed. It will be observed that the angled location of the U-shaped members are ergonomically correct which allows proper wrist and arm positioning. With the over-the-hand grip being used (wrist facing outwardly), it can be seen that the operator's wrists are allowed to be positioned in a manner so as to hold the wafer cassettes 18 without requiring excessive bending or flexing.

With an upward motion in the direction of arrow A (FIG. 9), the wafer cassettes can be raised and then lowered into the process chamber, as illustrated in FIG. 9. In order to remove the wafer cassettes 18, the operations just described are performed in the reverse order. As a result, the task of loading and unloading of the cassettes can be accomplished in a manner which reduces fatigue and stress to the operator.

From the foregoing detailed description, it can thus be seen that the present invention provides an improved handler attachment device used for manually lifting wafer cassettes from a spraying processor tool which is ergonomically correct so as to reduce fatigue and stress to the operator. The handler attachment device of the present invention is comprised of a rectangularly-shaped main body member, two U-shaped gripping members, and two L-shaped bracket members all interconnected together.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

We claim:

1. A handler attachment device used for loading and unloading of wafer cassettes into and out of a spray processing tool, comprising:

a rectangularly-shaped main body member having a front surface, a bottom surface, a top edge, a bottom edge and opposed side edges;

said top edge having a U-shaped cut-out portion disposed in its intermediate area so as to define a narrow middle section and opposed first and second end portions, said top edge extending along a horizontal axis;

said first end section having a first angled mounting area which includes a first transverse axis extending downwardly in a counter-clockwise direction with respect to said horizontal axis so as to form a first acute angle therebetween;

said second end portion having a second angled mounting area which includes a second transverse axis extending downwardly in a clockwise direction with respect to said horizonal axis so as to form a second acute angle therebetween;

two U-shaped gripping members each having a relatively long gripping arm portion and opposed short arm portions;

one of said short arm portions having a top edge extending along a longitudinal axis and a chamfered portion formed with a third transverse axis, said third transverse axis forming a third acute angle with respect to said longitudinal axis;

said chamfered portion on said one of said short arm portions of each of said two U-shaped gripping members being mounted on the corresponding first and second angled mounting areas on said body member;

two L-shaped bracket members having a longer leg portion and a shorter leg portion, each of said longer leg portions being mounted on the corresponding opposed edges of said body member so that said shorter leg portions extend inwardly therefrom; and said shorter leg portions of said L-shaped bracket members and said back surface of said body member forming a channel therebetween for contactly engaging with said wafer cassette, whereby said relatively long gripping arm portions are allowed to be gripped by an operator so that it reduces and minimizes fatigue and stress to the hands, wrists and arms.

2. A handler attachment device as claimed in claim 1, wherein said body member, U-shaped gripping members, and L-shaped bracket members are all formed of a durable plastic material.

3. A handler attachment device as claimed in claim 2, wherein said U-shaped gripping members and said L-shaped bracket members are welded to said body member.

4. A handler attachment device as claimed in claim 1, wherein said first acute angle between the first transverse axis and the horizontal axis is in the range of 30°–60°.

5. A handler attachment device as claimed in claim 4, wherein said first acute angle is approximately 55°.

6. A handler attachment device as claimed in claim 5, wherein said second acute angle between said second transverse axis and said horizontal axis is in the range of 30°–60°.

7. A handler attachment device as claimed in claim 6, wherein said second acute angle is approximately 55°.

8. A handler attachment device as claimed in claim 7, wherein said third acute angle between said third transverse axis and said longitudinal axis is in the range of 30°–70°.

9. A handler attachment device as claimed in claim 8, wherein said third acute angle is approximately 65°.

10. A handler attachment device used for loading and unloading of wafer cassettes into and out of a spray processing tool, comprising:

main body means having a first front surface, a bottom surface, a top edge, a bottom edge and opposed side edges;

said top edge having a U-shaped cut-out portion disposed in its intermediate area so as to define a narrow middle section and opposed first and second end portions, said top edge extending along a horizontal axis;

said first end section having a first angled mounting area which includes a first transverse axis extending downwardly in a counter-clockwise direction with respect to said horizontal axis so as to form a first acute angle therebetween;

said second end portion having a second angled mounting area which includes a second transverse axis extending downwardly in a clockwise direction with respect to said horizonal axis so as to form a second acute angle therebetween;

handle gripping means connected to said first and second angled mounting areas on said main body member means and extending outwardly therefrom;

said handle gripping means lying in a plane which forms a third acute angle with a plane of said body means; and bracket means connected to said opposed side edges of said body means for engaging with said wafer cassette, whereby said handle gripping means are gripped by an operator so as to reduce and minimize fatigue and stress to the hands, wrists and arms.

11. A handler attachment device as claimed in claim 10, wherein said body means, handle gripping means, and bracket means are all formed of a durable plastic material.

12. A handler attachment device as claimed in claim 11, wherein said gripping means and said bracket means are welded to said body means.

13. A handler attachment device as claimed in claim 10, wherein said first acute angle between the first transverse axis and the horizontal axis is in the range of 30°–60°.

14. A handler attachment device as claimed in claim 13, wherein said first acute angle is approximately 55°.

15. A handler attachment device as claimed in claim 14, wherein said second acute angle between said second transverse axis and said horizontal axis is in the range of 30°–60°.

16. A handler attachment device as claimed in claim 15, wherein said second acute angle is approximately 55°.

17. A handler attachment device as claimed in claim 16, wherein said third acute angle between said third transverse axis and said longitudinal axis is in the range of 30°–70°.

18. A handler attachment device as claimed in claim 17, wherein said third acute angle is approximately 65°.

* * * * *